United States Patent
Joi et al.

(10) Patent No.: US 9,476,124 B2
(45) Date of Patent: Oct. 25, 2016

(54) SELECTIVE DEPOSITION AND CO-DEPOSITION PROCESSES FOR FERROMAGNETIC THIN FILMS

(71) Applicant: LAM RESEARCH CORPORATION, Fremont, CA (US)

(72) Inventors: Aniruddha Joi, San Jose, CA (US); Ernest Chen, Cupertino, CA (US); Yezdi Dordi, Palo Alto, CA (US)

(73) Assignee: LAM RESEARCH CORPORATION, Fremont, CA (US)

(*) Notice: Subject to any disclaimer, the term of this patent is extended or adjusted under 35 U.S.C. 154(b) by 0 days.

(21) Appl. No.: 14/589,487

(22) Filed: Jan. 5, 2015

(65) Prior Publication Data
US 2016/0194761 A1   Jul. 7, 2016

(51) Int. Cl.
| | |
|---|---|
| *B05D 5/12* | (2006.01) |
| *C23C 18/52* | (2006.01) |
| *C23C 18/50* | (2006.01) |
| *C23C 18/31* | (2006.01) |
| *H01L 43/12* | (2006.01) |
| *C23C 18/32* | (2006.01) |

(52) U.S. Cl.
CPC .............. *C23C 18/52* (2013.01); *C23C 18/31* (2013.01); *C23C 18/32* (2013.01); *C23C 18/50* (2013.01); *H01L 43/12* (2013.01)

(58) Field of Classification Search
None
See application file for complete search history.

(56) References Cited

U.S. PATENT DOCUMENTS

| | | | | |
|---|---|---|---|---|
| 3,116,159 A | * | 12/1963 | Fisher | C23C 18/50 148/312 |
| 3,219,471 A | * | 11/1965 | Chilton | C23C 18/36 106/1.11 |
| 3,423,214 A | * | 1/1969 | Koretzky | C23C 18/36 106/1.22 |
| 3,523,823 A | * | 8/1970 | Kefalas | C23C 18/50 106/1.22 |
| 4,128,691 A | * | 12/1978 | Shirahata | G11B 5/656 427/128 |
| 4,659,605 A | * | 4/1987 | Malik | G11B 5/858 427/129 |
| 6,183,545 B1 | * | 2/2001 | Okuhama | C22B 3/0051 106/1.18 |
| 6,197,364 B1 | * | 3/2001 | Paunovic | C23C 18/36 427/126.1 |
| 8,268,400 B2 | * | 9/2012 | Nakahira | C23C 18/06 427/304 |
| 8,877,628 B2 | * | 11/2014 | Liu | H01L 27/2472 257/774 |
| 9,040,157 B2 | * | 5/2015 | Hao | A61K 49/0065 427/212 |
| 2004/0096592 A1 | * | 5/2004 | Chebiam | C23C 18/34 427/443.1 |
| 2005/0170650 A1 | * | 8/2005 | Fang | C23C 18/1893 438/689 |
| 2008/0038450 A1 | * | 2/2008 | Poole | C23C 18/40 427/97.9 |
| 2009/0087800 A1 | * | 4/2009 | Nakahira | C23C 18/06 430/325 |
| 2011/0245905 A1 | * | 10/2011 | Weber | A61L 31/044 623/1.15 |
| 2011/0311822 A1 | * | 12/2011 | Hao | A61K 49/0065 428/402.2 |
| 2014/0015143 A1 | * | 1/2014 | Liu | H01L 21/76807 257/774 |

* cited by examiner

Primary Examiner — David E Graybill

(57) ABSTRACT

A method for selectively depositing a ferromagnetic layer on a conducting layer, includes providing a substrate including a conducting layer; preparing a solution including a metal salt; adding a complexing agent to the solution; adding a reducing agent to the solution; while a temperature of the solution is less than 75° C., immersing the substrate in the solution for a predetermined period to deposit a ferromagnetic layer on the conducting layer by electroless deposition, wherein the ferromagnetic layer comprises one of cobalt (Co), iron (Fe) or CoFe; and after the predetermined period, removing the substrate from the solution.

19 Claims, 2 Drawing Sheets

SELECTIVE DEPOSITION AND CO-DEPOSITION PROCESSES FOR FERROMAGNETIC THIN FILMS

FIELD

The present disclosure relates to substrate processing, and more particularly to selective deposition or co-deposition processes for ferromagnetic thin films.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Electronic devices use integrated circuits including memory to store data. One type of memory that is commonly used in electronic devices is dynamic random-access memory (DRAM). DRAM stores each bit of data in a separate capacitor within the integrated circuit. The capacitor can be either charged or discharged, which represents the two values of a bit. Since non-conducting transistors leak, the capacitors will slowly discharge, and the information eventually fades unless the capacitor charge is refreshed periodically.

Each DRAM cell includes a transistor and a capacitor as compared to four or six transistors in static RAM (SRAM). This allows DRAM to reach very high storage densities. Unlike flash memory, DRAM is volatile memory (vs. non-volatile memory), since data is lost when power is removed.

Several emerging memory devices are potential replacements for DRAM. For example, DRAM replacements include non-volatile RAM (NVRAM) devices such as resistive RAM (RRAM or ReRAM), magnetoresistive RAM (MRAM), ferroelectric RAM (FRAM or FeRAM), spin-transfer torque RAM (STT-RAM), and phase-change RAM (PC-RAM).

In FIG. 1, an example of a portion of an MRAM stack 10 is shown. The MRAM stack 10 includes a substrate 14, an oxide layer 18, a bottom electrode 22, a fixed magnetic layer 26, a magnetic tunnel junction (MTJ) layer 30, a free magnetic layer 32, and a top electrode 34.

Spin-transfer torque involves changing the orientation of a magnetic layer in the MTJ layer 30 using a spin-polarized current. Charge carriers (such as electrons) have a property known as spin, which is a small quantity of angular momentum intrinsic to the carrier. Current is generally un-polarized. A spin polarized current is one with more electrons of either spin. By passing current through a thick magnetic layer (the fixed magnetic layer 26), a spin-polarized current can be produced. If the spin-polarized current is directed into the free magnetic layer 32, angular momentum can be transferred to change the orientation of the free magnetic layer 32.

In memory applications, when the spin of the free magnetic layer 32 is the same as the fixed magnetic layer 26, the memory cell has a low resistive state. When the spin of the free magnetic layer 32 is different than the fixed magnetic layer 26, the memory cell has a high resistive state.

Patterning an STT-RAM stack typically includes depositing ferromagnetic layers and then using reactive ion etching (RIE) to obtain the desired geometry. In some examples, the ferromagnetic layers may be deposited using physical vapor deposition (PVD). The RIE tends to cause unavoidable damage to the ferromagnetic layers and metal oxide layers, which reduces memory cell performance. The resulting etched STT-RAM stack also lacks a sufficiently sharp profile.

One process alternative to RIE involves selective electroless deposition. Some electroless deposition of Co and Fe based alloys use hypophosphites as a reducing agent. This approach, however, requires process temperatures of 75-90° C., which may damage spin states in the thin ferromagnetic films.

Electroless deposition processes using borohydride or dimethylamine borane to deposit CoFeB require high process temperatures. Additionally, in the electroless deposition processes using hypophosphite or boranes, Co and Fe concentrations cannot be modulated independent from the concentration of boron (B) or phosphorus (P). As a result, deposition of Fe-rich $Co_xFe_{1-x}$ film is not possible without a correspondingly high concentration of B or P. Furthermore, the high deposition rate of the reducing agents makes it difficult to control thicknesses less than 10 nm.

SUMMARY

A method for selectively depositing a ferromagnetic layer on a conducting layer includes providing a substrate including a conducting layer; preparing a solution including a metal salt; adding a complexing agent to the solution; adding a reducing agent to the solution; while a temperature of the solution is less than 75° C., immersing the substrate in the solution for a predetermined period to deposit a ferromagnetic layer on the conducting layer by electroless deposition, wherein the ferromagnetic layer comprises one of cobalt (Co), iron (Fe) or CoFe; and after the predetermined period, removing the substrate from the solution.

In other features, the reducing agent comprises titanium trichloride. The conducting layer comprises one of copper, ruthenium and cobalt. The temperature of the solution is less than or equal to 50° C. The metal salt includes at least one of ammonium iron(II) sulfate, cobalt(II) sulfate, iron(II) sulfate, iron(II) chloride, or cobalt(II) chloride. The metal salt includes at least one of cobalt acetate, cobalt chloride, cobalt nitrate, or cobalt(II) sulfate.

In other features, the complexing agent comprises at least one of tartaric acid, citric acid, gluconic acid or N-(hydroxyethyl)-ethylenediaminetriacetic acid (HEDTA).

In other features, the method includes adding a buffer to the solution prior to the immersing. The buffer includes boric acid. The method includes adding a pH balancer to the solution prior to the immersing. The pH balancer includes ammonium hydroxide.

In other features, the solution includes deionized, oxygen-free water, and wherein the metal salt is added to the deionized oxygen-free water.

In other features, the method includes adding 4,5-dihydroxy-1,3-benzenedisulfonic acid disodium salt (TiRon) to the solution prior to the immersing. The substrate forms part of a spin-transfer torque random access memory stack. The immersing is performed at a solution temperature between room temperature and 50° C.

A method for selectively depositing a ferromagnetic layer on a conducting layer includes providing a substrate including a conducting layer, wherein the conducting layer includes at least one of copper, ruthenium and cobalt; preparing a solution including deionized, oxygen-free water and a metal salt, wherein the metal salt includes at least one of ammonium iron(II) sulfate and cobalt(II) sulfate; adding a reducing agent including titanium trichloride to the solution; immersing the substrate in the solution for a predetermined period to deposit a ferromagnetic layer on the conducting layer by electroless deposition, wherein the ferromagnetic layer comprises one of cobalt (Co), iron (Fe) or CoFe; and after the predetermined period, removing the substrate from the solution.

In other features, a temperature of the solution is less than or equal to 50° C. during the immersing. The method includes adding a complexing agent to the solution before the immersing. The complexing agent comprises at least one of tartaric acid, citric acid, gluconic acid or N-(hydroxyethyl)-ethylenediaminetriacetic acid (HEDTA).

In other features, the method includes adding a buffer to the solution prior to the immersing. The buffer includes boric acid. The method includes adding a pH balancer to the solution prior to the immersing. The method includes adding 4,5-dihydroxy-1,3-benzenedisulfonic acid disodium salt (TiRon) to the solution prior to the immersing. The substrate forms part of a spin-transfer torque random access memory stack.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

An electroless deposition method according to the present disclosure may be used to deposit a conformal Co, CoFe or Fe layer on a conducting surface without the need for high process temperatures required for processes using hypophosphites and borohydride and without high boron concentrations. In some examples, the Co, CoFe or Fe layer and conducting layer form part of an MRAM stack. In some examples, the MRAM stack is an STT-MRAM stack.

Figure 1:
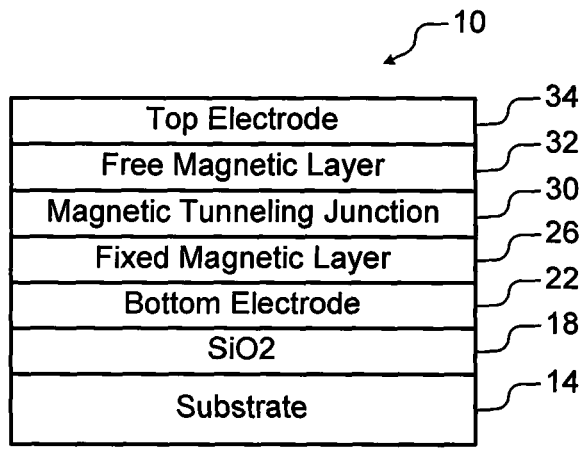
FIG. 1 is a cross-section of a magnetoresistive random access memory (MRAM) stack according to the prior art.
Figure 2A:
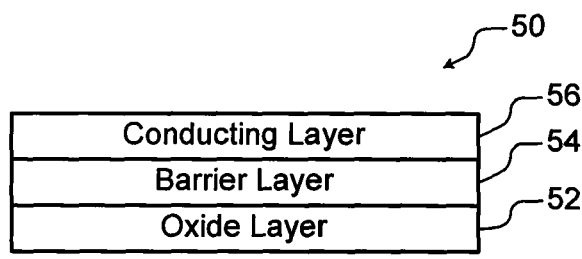
FIGS. 2A-2C are cross-section views of a portion of stack including a CoFe layer according to the present disclosure.
Figure 2B:
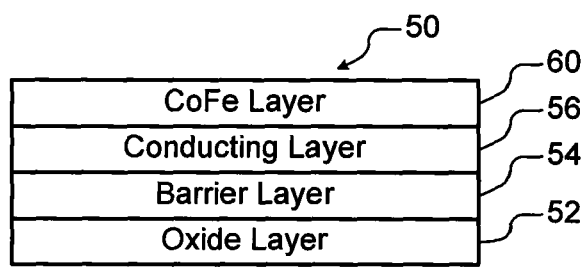

Referring now to FIG. 2A, a substrate 50 includes an oxide layer 52. A barrier layer 54 may be deposited on the oxide layer 52. A conducting layer 56 is deposited on the barrier layer 54 or the oxide layer 52. Referring now to FIG. 2B, a Co, CoFe or Fe layer 60 is deposited on the conducting layer 56 using electroless deposition as will be described further below.

Figure 2C:
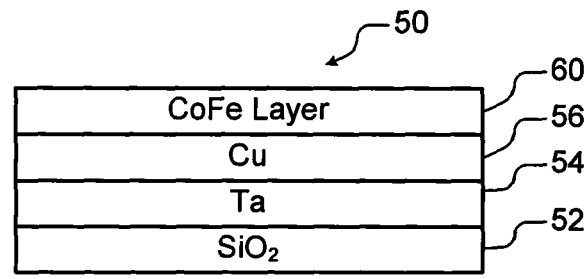

Referring now to FIG. 2C, the oxide layer may include silicon dioxide ($SiO_2$), although another type of oxide material may be used. The barrier layer 54 may include tantalum or tantalum nitride, although other barrier materials may be used. The conducting layer 56 may include copper (Cu), although other conducting materials may be used. For example only, the conducting layer 56 may include ruthenium or cobalt. The Co, CoFe or Fe layer 60 is deposited on the conducting layer 56 using electroless deposition as will be described further below.

Figure 3:
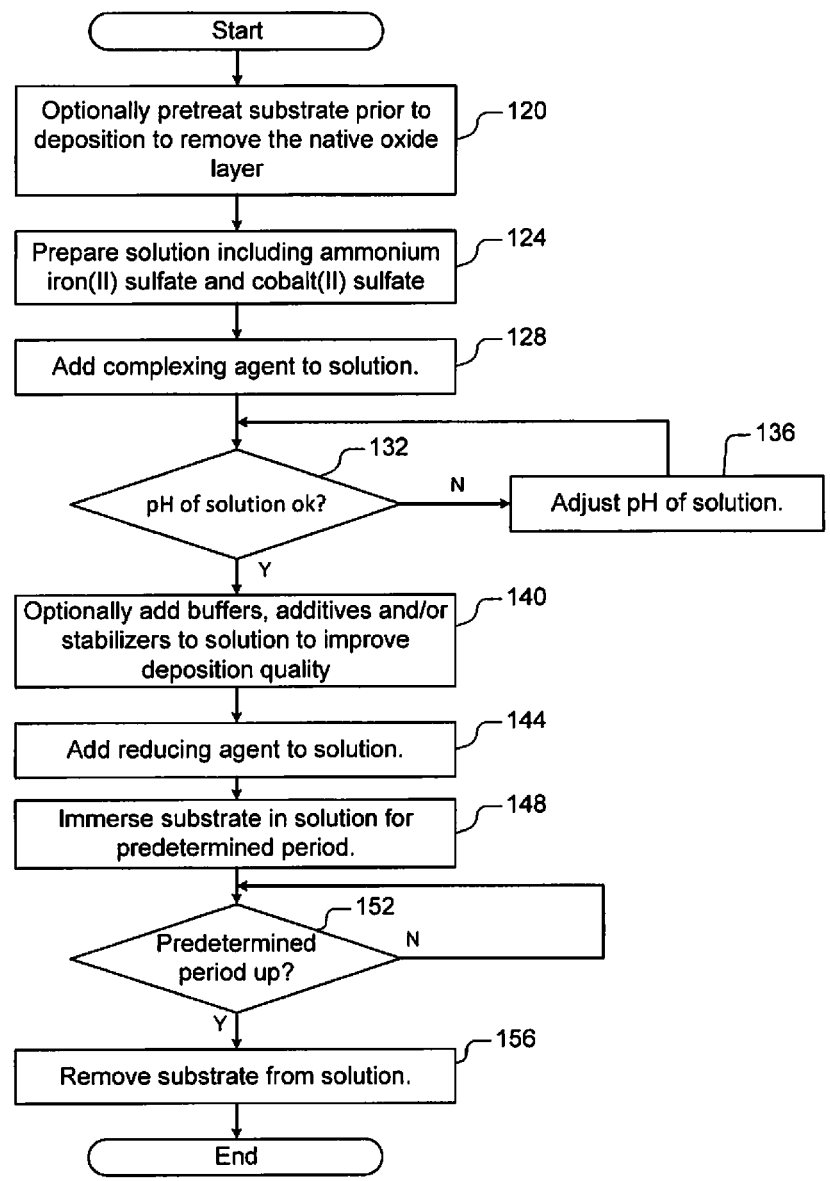
FIG. 3 illustrates a flowchart of a method for conformal co-deposition process for a ferromagnetic thin film according to the present disclosure.

Referring now to FIG. 3, prior to depositing the Co, CoFe or Fe layer, the substrate may be pretreated to remove the native oxide layer at 120. At 124, a solution is prepared that includes metal ions. In some examples, the solution includes deionized, oxygen-free water solvent. In some examples, ammonium iron(II) sulfate and cobalt(II) sulfate are used as the source of the metal ions. In other examples, the metal ions may be provided by other combinations of metal salts including one or more of iron(II) sulfate, iron(II) chloride, cobalt(II) chloride or acetates and nitrates. For example, ammonium iron(II) sulfate may be used because it tends to be more stable against oxidation in solution. Although, iron(II) sulfate heptahydrate and iron(II) chloride (Ferrous Chloride) can also be used as source of iron(II) metal ions. For example for cobalt, cobalt acetate, cobalt chloride and cobalt nitrate can also be used in addition to cobalt(II) sulfate.

At 128, a complexing agent may be added to the solution. In some examples, tartaric acid, N-(hydroxyethyl)-ethylenediaminetriacetic acid (HEDTA) and/or citric acid may be added to the solution. In other examples, the complexing agents may include gluconic acid or any carboxylic acid.

At 132, the pH of the solution is checked against a predetermined range. If the pH is not within the predetermined range, the pH of the solution may be adjusted at 136 and the method continues at 132. For example only, ammonium hydroxide ($NH_4OH$) may be added to the solution to adjust the pH of the solution to a predetermined pH range. For example, the predetermined pH range for the pH of the solution may be between approximately 8 and 10. In other examples, the predetermined pH range for the pH of the solution may be between approximately 8.8 and 9.2.

The method continues at 140 and buffers, additives and/or stabilizers may be added to the solution to improve deposition quality. For example only, boric acid may be added. Boric acid may be used as a buffer to prevent $Fe(OH)_3$ formation in solution due to local pH rise. For example only, TiRon (4,5-dihydroxy-1,3-benzenedisulfonic acid disodium salt) may also be added. TiRon is an additive/stabilizer.

At 144, a reducing agent is added to the solution before immersing the substrate. In some examples, the reducing agent may include titanium(III) chloride.

At 148, the substrate is immersed in the solution for a predetermined period to allow plating by electroless deposition. After the predetermined period (at 152), the substrate is removed from the solution at 156. In some examples, deposition occurs at or near room temperature, so no heating is required.

The electroless deposition method according to the present disclosure allows deposition of a conformal Co, CoFe or Fe layer on a conducting surface while avoiding damage associated with other processes such as reactive ion etching. Furthermore, the electroless deposition method according to the present disclosure enables scaling. The electroless deposition method according to the present disclosure also offers some advantages with respect to conventional borane-based or hypophosphite-based electroless deposition processes. The cobalt to iron ratio in the deposited film can be tuned independent of the boron or phosphorus content simply by tuning concentrations of the precursors.

Also, owing to its relatively slower deposition rate, the thickness of the deposited film can be more precisely controlled to less than 10 nm. For example only for a 10 nm layer in stagnant electrolyte, plating time is approximately 15 minutes.

The deposition rate can be increased by agitation. Alternately, the deposition rate may be increased from room temperature to an elevated deposition temperature up to 50 to 75° C. For example only, deposition at temperatures greater than room temperature tends to increase the deposition rate for some ferromagnetic materials.

Furthermore, using titanium(III) chloride as the reducing agent is easier than borane-based reducing agents, which are known to be unstable and generate hydrogen gas in ambient conditions. In order to obtain an iron-rich deposit, a high concentration of borohydride or dimethylamine borane is required in the solution, which is not practical for selective deposition.

In a first example set forth below, a recipe for selective CoFe electroless deposition is shown:

|  | Concentration (M) |
| --- | --- |
| cobalt(II) sulfate | 0.0225 |
| ammonium iron(II) sulfate | 0.0525 |
| N-(2-Hydroxyethyl)ethylenediamine-N,N',N'-triacetic acid, trisodium salt | 0.0225 |
| ammonia (as 29% solution) | 1.35 |
| boric acid | 0.032 |
| tartaric acid | 0.100 |
| 4,5-dihydroxy-1,3-benzenedisulfonic acid disodium salt (TiRon) | 0.004 |
| titanium trichloride | 0.06 |
| citric acid | 0.18 |
| pH | 9 |

In a second example set forth below, a recipe for selective Co electroless deposition is shown:

|  | Concentration (M) |
| --- | --- |
| cobalt(II) sulfate | 0.075 |
| ammonia (as 29% solution) | 0.77 |
| gluconic acid | 0.075 |
| ascorbic acid | 0.015 |
| titanium trichloride | 0.03 |
| citric acid | 0.09 |
| pH | 9.3 |

In a third example set forth below, a recipe for selective Fe electroless deposition is shown:

|  | Concentration (M) |
| --- | --- |
| ammonium iron(II) sulfate | 0.075 |
| ammonia (as 29% solution) | 1.2 |
| boric acid | 0.032 |
| tartaric acid | 0.100 |
| 4,5-dihydroxy-1,3-benzenedisulfonic acid disodium salt (TiRon) | 0.004 |
| titanium trichloride | 0.06 |
| citric acid | 0.18 |
| pH | 9 |

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

What is claimed is:

1. A method for selectively depositing a ferromagnetic layer on a conducting layer, comprising:
providing a substrate including a conducting layer;
preparing a solution including a metal salt;
adding a complexing agent to the solution;
adding a reducing agent to the solution, wherein the reducing agent comprises titanium trichloride and does not include any one of hypophosphite, borohydride, and dimethylamine borane;
while a temperature of the solution is less than 50° C., immersing the substrate in the solution for a predetermined period to deposit a ferromagnetic layer on the conducting layer by electroless deposition, wherein the ferromagnetic layer comprises one of cobalt (Co), iron (Fe) or CoFe; and
after the predetermined period, removing the substrate from the solution.

2. The method of claim 1, wherein the conducting layer comprises one of copper, ruthenium and cobalt.

3. The method of claim 1, wherein the metal salt includes at least one of ammonium iron(II) sulfate, cobalt(II) sulfate, iron(II) sulfate, iron(II) chloride, or cobalt(II) chloride.

4. The method of claim 1, wherein the metal salt includes at least one of cobalt acetate, cobalt chloride, cobalt nitrate, or cobalt(II) sulfate.

5. The method of claim 1, wherein the complexing agent comprises at least one of tartaric acid, citric acid, gluconic acid or N-(hydroxyethyl)-ethylenediaminetriacetic acid (HEDTA).

6. The method of claim 1, further comprising adding a buffer to the solution prior to the immersing.

7. The method of claim 6, wherein the buffer includes boric acid.

8. The method of claim 1, further comprising adding a pH balancer to the solution prior to the immersing.

9. The method of claim 8, wherein the pH balancer includes ammonium hydroxide.

10. The method of claim 1, wherein the solution includes deionized, oxygen-free water, and wherein the metal salt is added to the deionized oxygen-free water.

11. The method of claim 1, further comprising adding 4,5-dihydroxy-1,3-benzenedisulfonic acid disodium salt to the solution prior to the immersing.

12. The method of claim 1, wherein the substrate forms part of a spin-transfer torque random access memory stack.

13. The method of claim 1, wherein the immersing is performed at a solution temperature between room temperature and 50° C.

14. A method for selectively depositing a ferromagnetic layer on a conducting layer, comprising:
providing a substrate including a conducting layer, wherein the conducting layer includes at least one of copper, ruthenium and cobalt;
preparing a solution including deionized, oxygen-free water and a metal salt, wherein the metal salt includes at least one of ammonium iron(II) sulfate and cobalt(II) sulfate;

adding a reducing agent including titanium trichloride to the solution, wherein the reducing agent does not include any one of hypophosphite, borohydride, and dimethylamine borane;

immersing the substrate in the solution for a predetermined period to deposit a ferromagnetic layer on the conducting layer by electroless deposition, wherein the ferromagnetic layer comprises one of cobalt (Co), iron (Fe) or CoFe, and wherein a temperature of the solution is less than or equal to 50° C. during the immersing; and after the predetermined period, removing the substrate from the solution.

15. The method of claim 14, further comprising adding a complexing agent to the solution before the immersing, wherein the complexing agent comprises at least one of tartaric acid, citric acid, gluconic acid or N-(hydroxyethyl)-ethylenediaminetriacetic acid (HEDTA).

16. The method of claim 14, further comprising adding a buffer to the solution prior to the immersing, wherein the buffer includes boric acid.

17. The method of claim 14, further comprising adding a pH balancer to the solution prior to the immersing.

18. The method of claim 14, further comprising adding 4,5-dihydroxy-1,3-benzenedisulfonic acid disodium salt to the solution prior to the immersing.

19. The method of claim 14, wherein the substrate forms part of a spin-transfer torque random access memory stack.

* * * * *